United States Patent
Kim et al.

(10) Patent No.: US 11,700,753 B2
(45) Date of Patent: Jul. 11, 2023

(54) ORGANIC LIGHT EMITTING DIODE (OLED) DISPLAY DEVICE

(71) Applicants: LG Display Co., Ltd., Seoul (KR); UIF (UNIVERSITY INDUSTRY FOUNDATION), YONSEI UNIVERSITY, Seoul (KR)

(72) Inventors: Young-Joo Kim, Seoul (KR); Hyo-Jun Kim, Seoul (KR); Jeong Min Moon, Paju-si (KR); Su Seok Choi, Paju-si (KR); Sungpil Ryu, Paju-si (KR); Jihwan Jung, Paju-si (KR); Kiseok Chang, Paju-si (KR)

(73) Assignees: LG DISPLAY CO., LTD., Seoul (KR); UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 591 days.

(21) Appl. No.: 16/759,711

(22) PCT Filed: Sep. 12, 2018

(86) PCT No.: PCT/KR2018/010693
§ 371 (c)(1),
(2) Date: Apr. 27, 2020

(87) PCT Pub. No.: WO2019/083162
PCT Pub. Date: May 2, 2019

(65) Prior Publication Data
US 2020/0335571 A1    Oct. 22, 2020

(30) Foreign Application Priority Data

Oct. 27, 2017   (KR) ........................ 10-2017-0141262

(51) Int. Cl.
*H01L 27/32*   (2006.01)
*H10K 59/131*   (2023.01)
(Continued)

(52) U.S. Cl.
CPC ......... *H10K 59/131* (2023.02); *H10K 50/115* (2023.02); *H10K 50/858* (2023.02); *H10K 59/38* (2023.02)

(58) Field of Classification Search
CPC .... H01L 27/322; H01L 27/3276; H10K 59/38
See application file for complete search history.

(56) References Cited

U.S. PATENT DOCUMENTS

2006/0012901 A1   1/2006   Shigemura et al.
2006/0071233 A1   4/2006   Cho et al.
(Continued)

FOREIGN PATENT DOCUMENTS

CN   104538430 A   4/2015
JP   2014-052606 A   3/2014
(Continued)

OTHER PUBLICATIONS

Korean Office Action dated Jun. 8, 2021 issued in corresponding Patent Application No. 10-2017-0141262 (5 pages).

*Primary Examiner* — Douglas M Menz
(74) *Attorney, Agent, or Firm* — Polsinelli PC

(57) ABSTRACT

An organic light emitting diode (OLED) display device includes a thin film transistor substrate including a first substrate, a thin film transistor disposed on the first substrate and a white organic light emitting diode (WOLED) electrically connected to the thin film transistor; a color filter substrate comprising a second substrate that faces the first substrate, and red, green and blue color filters disposed on the second substrate; a quantum dot pattern disposed on the WOLED of the thin film transistor substrate; and a refractive (Continued)

film disposed between the color filter substrate and the thin film transistor substrate provided with the quantum dot pattern.

14 Claims, 6 Drawing Sheets

(51) Int. Cl.
*H10K 50/115* (2023.01)
*H10K 50/858* (2023.01)
*H10K 59/38* (2023.01)

(56) References Cited

U.S. PATENT DOCUMENTS

| | | |
|---|---|---|
| 2007/0200492 A1 | 8/2007 | Cok et al. |
| 2013/0082244 A1 | 4/2013 | Heller et al. |
| 2017/0141162 A1 | 5/2017 | Kim et al. |

FOREIGN PATENT DOCUMENTS

| | | |
|---|---|---|
| JP | 2015-008036 A | 1/2015 |
| JP | 2016-218151 A | 12/2016 |
| KR | 10-2006-0030395 A | 4/2006 |
| KR | 10-2014-0039493 A | 4/2014 |
| KR | 10-2015-0039066 A | 4/2015 |
| KR | 10-2017-0096583 A | 8/2017 |
| WO | WO 2013-077106 A1 | 5/2013 |
| WO | WO 2016/098954 A1 | 6/2016 |
| WO | WO 2016/204166 A1 | 12/2016 |

ORGANIC LIGHT EMITTING DIODE (OLED) DISPLAY DEVICE

CROSS REFERENCE TO RELATED APPLICATIONS

This application is a National Stage of Patent Application No. PCT/KR2018/010693 filed on Sep. 12, 2018, which claims priority from Korean Patent Application No. 10-2017-0141262 filed on Oct. 27, 2017, which are hereby incorporated by reference in their entirety.

BACKGROUND

Field of the Disclosure

The present disclosure relates to an organic light emitting diode (OLED) display device, and more particularly, to an OLED display device with improved light extraction efficiency.

Description of the Background

With the development of information-oriented society, demands for a display device for displaying an image have increased in various forms. Recently, various display devices such as a liquid crystal display (LCD) device, a plasma display panel (PDP), an organic light emitting diode (OLED) display device and the like have been utilized.

Among them, the PDP has been emerged as a display device that is most advantageous in enlarging a screen while being light, thin, short and small because of its simple structure and manufacturing process, but it has disadvantages of low light emission efficiency, low luminance and high power consumption.

Further, the LCD device is one of the most widely used flat panel display devices, but has problems of a narrow viewing angle and a low response speed.

In contrast, the OLED display device has advantages of high response speed, high light emission efficiency, high luminance and a wide viewing angle.

In such an OLED display device, three pixels with colors of red, green and blue are used in a display driving mode. Recently, a way of adding a white pixel to the pixels to the OLED display device has been studied as one of effective ways to reduce power efficiency, and an OLED display device made by combining a white organic light emitting diode (WOLED) and a color filter has been known.

As described above, the OLED display device based on the WOLED and the color filter is advantageous in terms of a size enlargement and yield in comparison to an OLED display device based on red, green and blue organic light emitting layers. However, a use of the color filter results in loss of light emitted from the WOLED, whereby there is a problem of poor light extraction efficiency.

Aspects of the present disclosure provide an organic light emitting diode (OLED) display device which may include a quantum dot pattern disposed between a thin film transistor substrate and a color filter substrate and a refractive film inserted between a color filter and the quantum dot pattern, thereby maximizing light extraction efficiency.

As a result, the OLED display device according to aspects of the present disclosure may include a silica aerogel film with excellent total reflection and scattering properties disposed between the quantum dot pattern and the color filter.

Accordingly, the OLED display device according to aspects of the present disclosure may have a recycle structure in which light that is lost while passing through the quantum dot pattern among light emitted from a white organic light emitting diode (WOLED) is reabsorbed into the quantum dot pattern and emitted toward the color filter.

An organic light emitting diode (OLED) display device according to aspects of the present disclosure may include a refractive film inserted between a color filter and a quantum dot pattern, thereby maximizing light extraction efficiency.

To this end, the OLED display device according to aspects of the present disclosure may include a thin film transistor substrate provided with a white organic light emitting diode (WOLED), a color filter substrate provided with red, green and blue color filters, a quantum dot pattern disposed on the WOLED, and a low reflective film disposed between the thin film transistor substrate provided with the quantum dot pattern and the color filter substrate.

Here, the quantum dot pattern may include a green quantum dot pattern disposed between the WOLED and the green color filter, and a red quantum dot pattern disposed between the WOLED and the red color filter.

At this time, the refractive film may be disposed in an integrated structure between the thin film transistor substrate and the color filter substrate, and accordingly may be disposed on the green quantum dot pattern and the red quantum dot pattern to overlap with the green quantum dot pattern and the red quantum dot pattern.

Also, the refractive film may be a silica aerogel film having a refractive index of 1.1 or less.

The silica aerogel film may have a plurality of pores therein, and the plurality of pores each may have an average diameter of 10 to 50 nm.

Furthermore, the refractive film may have a thickness of 10 μm or less.

In an organic light emitting diode (OLED) display device according to aspects of the present disclosure, a silica aerogel film with excellent total reflection and scattering properties may be disposed between a quantum dot pattern and a color filter.

As a result, the OLED display device according to aspects of the present disclosure may have a recycle structure in which light that is lost while passing through the quantum dot pattern among light emitted from a white organic light emitting diode (WOLED) is reabsorbed into the quantum dot pattern and emitted toward the color filter.

Accordingly, the OLED display device according to aspects of the present disclosure may further improve light extraction efficiency by increasing light absorption of the quantum dot pattern through application of the silica aerogel film with excellent total reflection and scattering properties.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
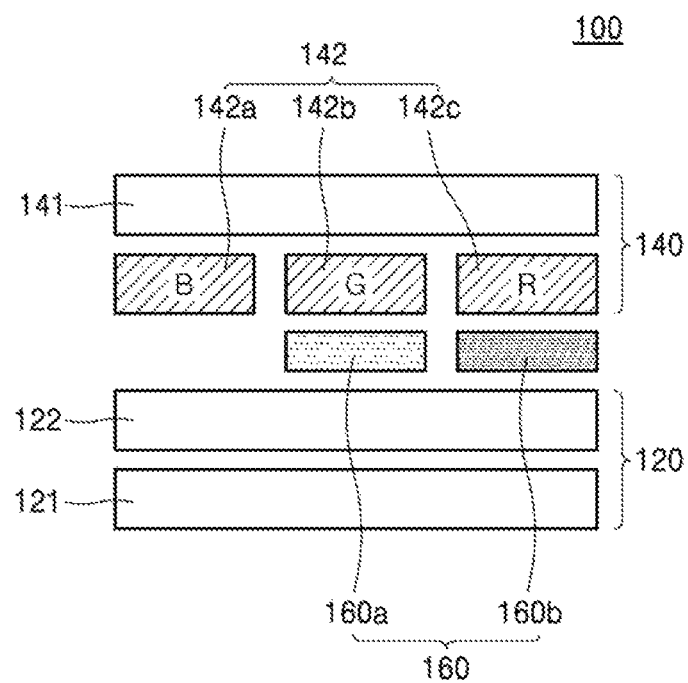
FIG. 1 is a cross-sectional view illustrating an organic light emitting diode (OLED) display device according to a first aspect of the present disclosure.

The aforementioned aspects, features and advantages will be described in detail with reference to the accompanying drawings, such that those skilled in the art can easily carry out a technical idea of the present disclosure. In the description of the aspects, the detailed description of well-known related configurations or functions will be omitted when it is deemed that such description will cause ambiguous interpretation of the present disclosure. Hereinafter, preferred aspects of the present disclosure will be described in detail with reference to the accompanying drawings. In the drawings, same reference numerals designate same or like elements.

Hereinafter, an organic light emitting diode (OLED) display device according to preferred aspects of the present disclosure will be described in detail with reference to the accompanying drawings.

Figure 2:
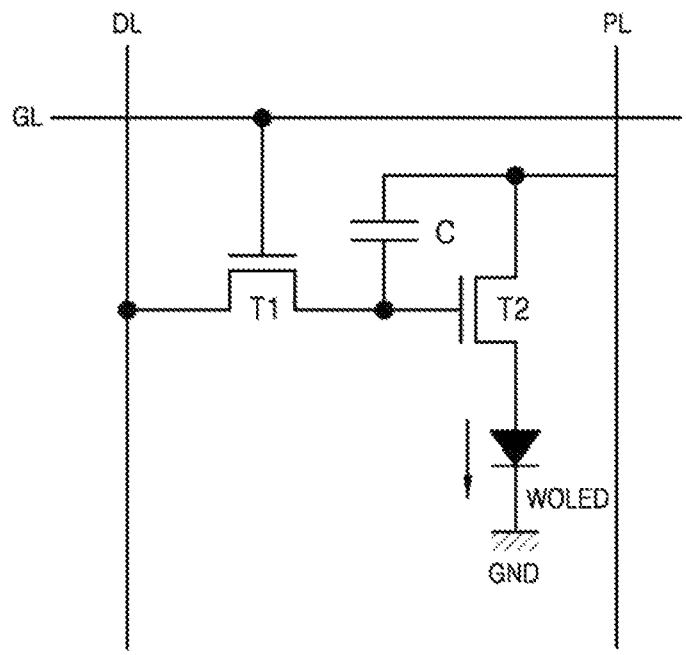
FIG. 2 is a circuit diagram illustrating the OLED display device according to the first aspect of the present disclosure.
Figure 3:
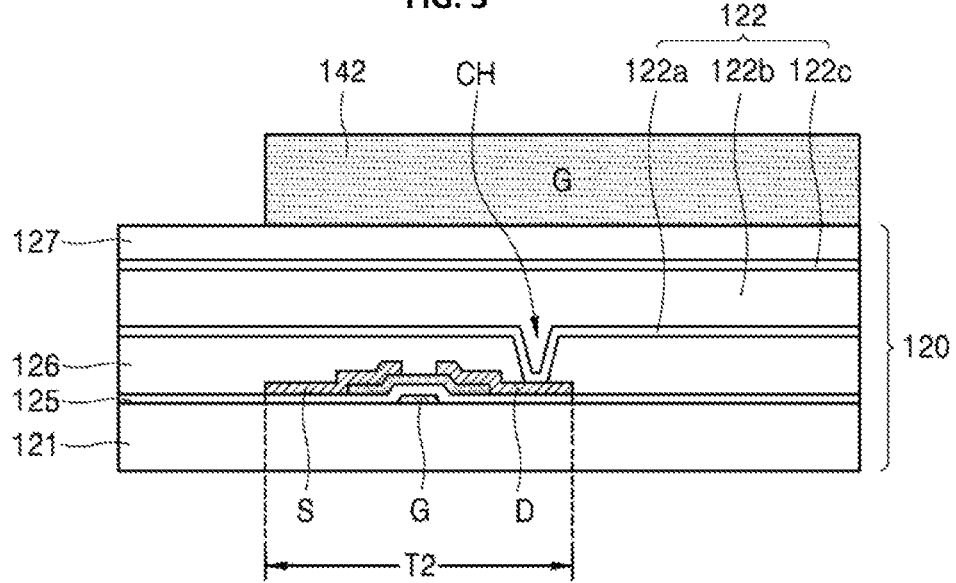
FIG. 3 is a cross-sectional view illustrating a portion of the thin film transistor substrate of FIG. 1.

FIG. 1 is a cross-sectional view illustrating an OLED display device according to a first aspect of the present disclosure. FIG. 2 is a circuit diagram illustrating a unit pixel of the OLED display device according to the first aspect of the present disclosure. FIG. 3 is a cross-sectional view illustrating the thin film transistor substrate of FIG. 1.

First, as illustrated in FIG. 1, an OLED display 100 according to the first aspect of the present disclosure may include a thin film transistor substrate 120 provided with a white organic light emitting diode (WOLED) 122, a color filter substrate 140 provided with red, green and blue color filters 142a, 142b and 142c, and a quantum dot pattern 160.

The thin film transistor substrate 120 may include a first substrate 121, a thin film transistor disposed on the first substrate 121, and the WOLED 122 connected to the thin film transistor.

The color filter substrate 140 may include a second substrate 141 that faces the first substrate 121, and a color filter 142 including the red, green and blue color filters 142a, 142b and 142c disposed on the second substrate 141.

The details of the thin film transistor substrate 120 will be described with reference to FIGS. 2 and 3.

As illustrated in FIG. 2, the OLED display device according to the first aspect of the present disclosure may include a cell driving unit DU connected to a gate line GL, a data line DL and a power supply line PL, and a WOLED connected between the cell driving unit DU and a ground GND.

The cell driving unit DU may include a switch thin film transistor T1 connected to the gate line GL and the data line DL, a driving thin film transistor T2 connected to the switch thin film transistor T1, the power supply line PL and a first electrode of the WOLED, and a storage capacitor C connected between the power supply line PL and a drain electrode of the switch thin film transistor T1.

A gate electrode of the switch thin film transistor T1 may be connected to the gate line GL; a source electrode thereof may be connected to the data line DL; and, the drain electrode thereof may be connected to a gate electrode of the driving thin film transistor T2 and the storage capacitor C.

A source electrode of the driving thin film transistor T2 may be connected to the power supply line PL and a drain electrode thereof may be connected to the first electrode of the WOLED. The storage capacitor C may be connected between the power supply line PL and the gate electrode of the driving thin film transistor T2.

When a scan pulse is supplied to the gate line GL, the switch thin film transistor T1 may be turned on and supply a data signal supplied to the data line DL to the storage capacitor C and the gate electrode of the driving thin film transistor T2.

The driving thin film transistor T2 may adjust an amount of light emitted from the WOLED by controlling current supplied from the power supply line PL to the WOLED in response to the data signal supplied to the gate electrode.

Even when the switch thin film transistor T1 is turned off, the driving thin film transistor T2 may supply constant current by means of voltage charged in the storage capacitor C until a data signal of a next frame is supplied, whereby the WOLED may maintain light emission.

As illustrated in FIG. 3, the thin film transistor substrate 120 may include a first substrate 121, a thin film transistor T2 disposed on the first substrate 121, and a WOLED 122 connected to the thin film transistor T2.

At this time, the thin film transistor T2 may be the driving thin film transistor illustrated in FIG. 2.

The thin film transistor T2 may include a gate electrode G that extends from a gate line, a gate insulating layer 125 that covers the gate electrode G, a semiconductor layer H formed on the gate insulating layer 125 in an area corresponding to the gate electrode G, and a source electrode S and a drain electrode D that expose a portion of the semiconductor layer H and are separated from each other on the gate insulating layer 125.

The semiconductor layer H may be formed of a silicon semiconductor or an oxide semiconductor, but is not limited thereto.

FIG. 3 illustrates the thin film transistor T2 having a gate bottom structure in which the gate electrode G is disposed below the source electrode S and the drain electrode D, but the aforementioned structure is merely an example. Therefore, the thin film transistor T2 may have a gate top structure in which the gate electrode G is disposed on the source electrode S and the drain electrode D.

Also, the thin film transistor substrate 120 may further include a protective layer 126 that covers the thin film transistor T2 and planarizes a surface thereof, a WOLED 122 disposed on the protective layer 126, and a planarizing layer 127 that covers the WOLED 122.

At this time, the protective layer 126 may be provided with a drain contact hole CH that exposes a portion of the drain electrode D.

The WOLED 122 may include a first electrode 122a connected to the drain electrode D through the drain contact hole CH, a white organic light emitting layer 122b disposed on the first electrode 122a, and a second electrode 122c disposed on the white organic light emitting layer 122b.

Here, the aforementioned quantum dot pattern 160 may be disposed on the planarizing layer 127 of the thin film transistor substrate 120. Considering ease of a size enlargement, it is preferable to form a quantum dot material layer over an entire upper surface of the planarizing layer 127, and then form a quantum dot pattern 160 by patterning the quantum dot material layer using a photolithography method.

Referring back to FIG. 1, the OLED display device 100 according to the first aspect of the present disclosure may differ from the OLED display device based on red, green and blue organic light emitting layers since the WOLED 122 is disposed on the entire first substrate 121, and therefore the OLED display device 100 is advantageous in terms of a size enlargement and yield. However, a use of the red, green and blue color filters 142a, 142b and 142c results in loss of light emitted from the WOLED 122, whereby there is a problem of poor light extraction efficiency.

To this end, the OLED display device 100 according to the first aspect of the present disclosure may include the quantum dot pattern 160 disposed between the thin film transistor substrate 120 and the color filter substrate 140, thereby improving light extraction efficiency.

At this time, the quantum dot pattern 160 may include a green quantum dot pattern 160a disposed between the WOLED 122 and the green color filter 142b, and a red quantum dot pattern 160b disposed between the WOLED 122 and the red color filter 142c.

As described above, in the first aspect of the present disclosure, the green quantum dot pattern 160a may be disposed at a location that overlaps with the green color filter 142b, and the red quantum dot pattern 160b may be disposed at a location that overlaps with the red color filter 142c.

Accordingly, in the case of a pixel provided with the red color filter 142c, blue (B) and green (G) light may be absorbed by the red quantum dot pattern 160b, and the absorbed light may be wavelength-converted into required red (R) light, thereby improving light extraction efficiency.

Also, in the case of a pixel provided with the green color filter 142b, blue (B) light may be absorbed by the green quantum dot pattern 160a, and the absorbed light may be wavelength-converted into required green (G) light, thereby improving light extraction efficiency.

Figure 4:
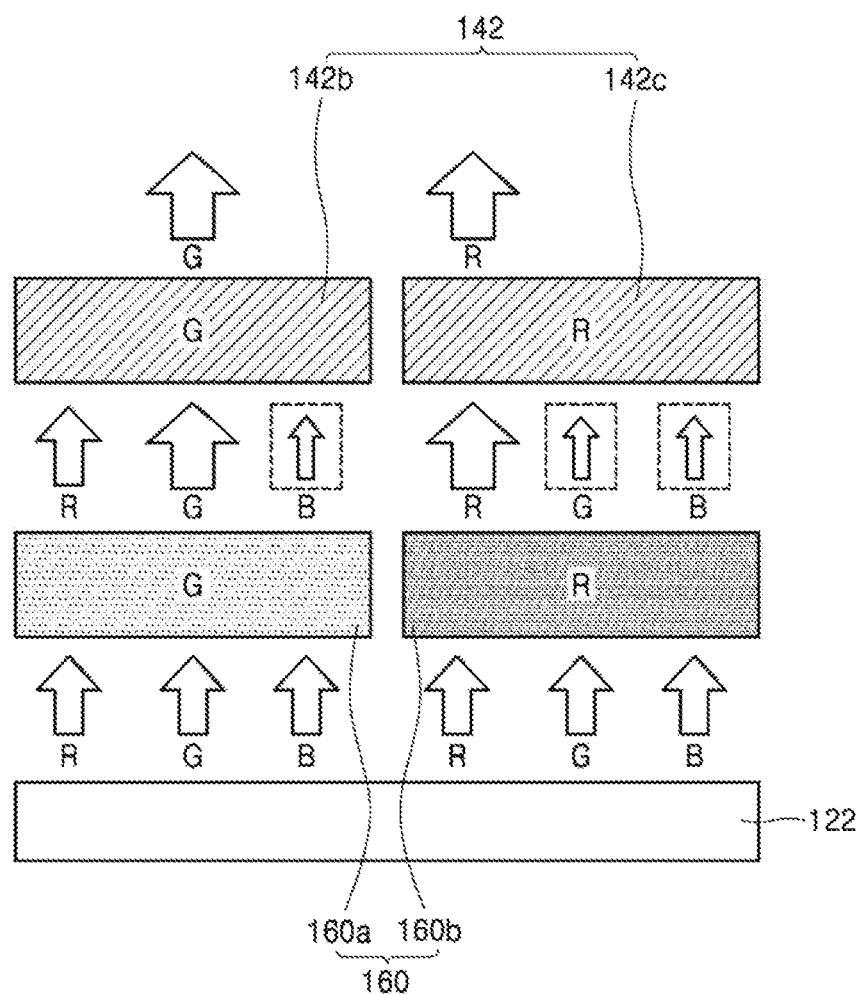
FIG. 4 is a schematic diagram illustrating a light emitting structure of the OLED display device according to the first aspect of the present disclosure.

FIG. 4, which is a schematic diagram illustrating a light emitting structure of the OLED display device according to the first aspect of the present disclosure, will be described in connection with FIG. 1.

As illustrated in FIGS. 1 and 4, in the OLED display 100 according to the first aspect of the present disclosure, the quantum dot pattern 160 may be disposed between the thin film transistor substrate 120 and the color filter substrate 140. At this time, the green quantum dot pattern 160a may be disposed at a location that overlaps with the green color filter 142b and the red quantum dot pattern 160b may be disposed at a location that overlaps with the red color filter 142c.

Accordingly, in the case of a pixel provided with the red color filter 142c, blue (B) and green (G) light may be absorbed by the red quantum dot pattern 160b, and the absorbed light may be wavelength-converted into required red (R) light, thereby improving light extraction efficiency.

Also, in the case of a pixel provided with the green color filter 142b, blue (B) light may be absorbed by the green quantum dot pattern 160a, and the absorbed light may be wavelength-converted into required green (G) light, thereby improving light extraction efficiency.

At this time, the quantum dot pattern 160 may be disposed on the WOLED 122 of the thin film transistor substrate 120. The quantum dot pattern 160 may be formed by a photolithography method, a printing method, an imprinting method and the like. The photolithography method may be used in consideration of ease of a size enlargement.

Here, the quantum dot pattern 160 may have a low thickness of about 1 to 3 μm in consideration of a selective patterning process using the photolithography method as well as may have a limitation with respect to a concentration due to an aggregation between fluorescent materials dispersed therein.

Such limitations may cause a problem that the quantum dot pattern 160 does not absorb all the light emitted from the WOLED 122. The light that is not absorbed by the quantum dot pattern 160 may be absorbed by the color filter 142, thereby reducing light extraction efficiency.

In order to solve this problem, an OLED display device according to the second aspect of the present disclosure may include a refractive film inserted between the color filter and the quantum dot pattern, thereby maximizing light extraction efficiency. Such a configuration of the OLED display device will be described in detail with reference to the accompanying drawings.

Figure 5:
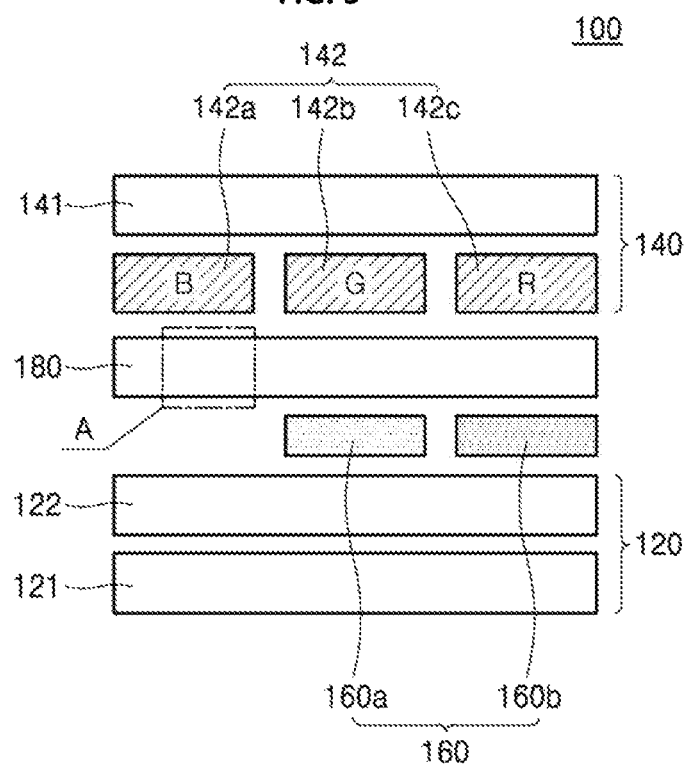
FIG. 5 is a cross-sectional view illustrating an OLED display device according to a second aspect of the present disclosure.
Figure 6:
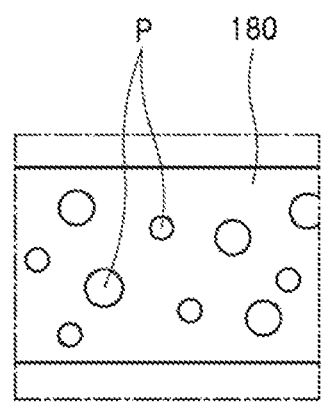
FIG. 6 is an enlarged cross-sectional view illustrating the refractive film of FIG. 5.

FIG. 5 is a cross-sectional view illustrating the OLED display device according to the second aspect of the present disclosure. FIG. 6 is an enlarged cross-sectional view illustrating the refractive film of FIG. 5. The same reference numerals are given to the same elements as those of the first aspect of the present disclosure.

Referring to FIGS. 5 and 6, an OLED display device 100 according to the second aspect of the present disclosure may include a thin film transistor substrate 120 provided with a WOLED 122, a color filter substrate 142 provided with red, green and blue color filters 142a, 142b and 142c, a quantum dot pattern 160 and a refractive film 180.

The thin film transistor substrate 120 may include a first substrate 121, a thin film transistor disposed on the first substrate 121, and the WOLED 122 connected to the thin film transistor.

The color filter substrate 140 may include a second substrate 141 that faces the first substrate 121, and a color filter 142 including red, green and blue color filters 142a, 142b and 142c disposed on the second substrate 141.

The quantum dot pattern 160 may be disposed on the WOLED 122 of the thin film transistor substrate 120. The quantum dot pattern 160 may include a green quantum dot pattern 160a disposed between the WOLED 122 and the green color filter 142b, and a red quantum dot pattern 160b disposed between the WOLED 122 and the red color filter 142c.

The refractive film 180 may be disposed between the color filter substrate 140 and the thin film transistor substrate 120 provided with the quantum dot pattern 160. The refractive film 180 may be disposed in an integrated structure between the thin film transistor substrate 120 and the color filter substrate 140, and accordingly may be disposed on the green quantum dot pattern and the red quantum dot pattern to overlap with the green quantum dot pattern and the red quantum dot pattern. The refractive film 180 may have an area corresponding to the thin film transistor substrate 120.

The refractive film 180 may have a low refractive index of 1.1 or less, or a refractive index of 1.02 to 1.10. In particular, the refractive film 180 may be an aerogel film or a silica aerogel film.

Such a silica aerogel film 180 may be aerogel of silicon dioxide having extremely high porosity. When jelly-like silica gel is dried and dehydrated, the silica gel may be shrunk by a capillary force of water to become a hard silica gel. When a jelly is heated above a critical temperature of liquid, the jelly may become gas. Even when the gas is removed, silicon dioxide remains in the original colloidal dispersion state. Accordingly, the silica aerogel film 180 may have a plurality of pores P therein. The plurality of pores P each may have an average diameter of 10 to 50 nm.

In particular, as the refractive film 180 is thinner, it may be advantageous in terms of light extraction efficiency. However, there may be a manufacturing problem when the refractive film 180 is manufactured to be too thin. Therefore, the refractive film 180 may have a thickness of 10 μm or less, or 2 to 10 μm.

As described above, in the second aspect of the present disclosure, the silica aerogel film 180 with excellent total reflection and scattering properties may be disposed between the quantum dot pattern 160 and the color filter 142. As a result, the OLED display device according to the second aspect of the present disclosure may have a recycle structure in which light that is lost while passing through the quantum dot pattern 160 among light emitted from the WOLED 122 is reabsorbed into the quantum dot pattern 160 and emitted toward the color filter 142.

Accordingly, the OLED display device 100 according to the second aspect of the present disclosure may improve total light extraction efficiency by increasing light absorption of the quantum dot pattern 160 through application of the silica aerogel film 180 with excellent total reflection and scattering properties.

Figure 7:
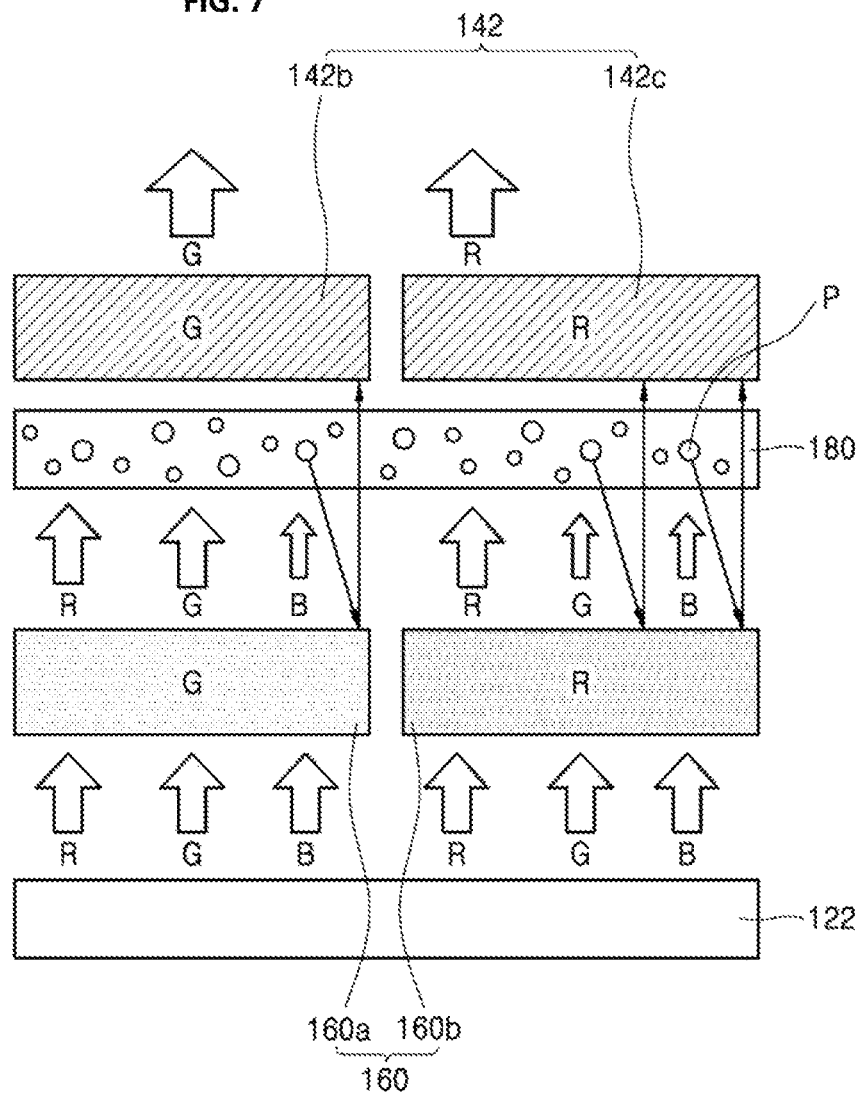
FIG. 7 is a schematic diagram illustrating a light emitting structure of the OLED display device according to the second aspect of the present disclosure.

FIG. 7 is a schematic diagram illustrating a light emitting structure of the OLED display device according to the second aspect of the present disclosure.

As illustrated in FIG. 7, in the case of a pixel provided with the green color filter 142b, green (G) light emitted from the WOLED 122 may be emitted through the green quantum dot pattern 160a, the silica aerogel film 180, and the green color filter 142b.

Blue (B) light emitted from the WOLED 122 may be partially absorbed into the green quantum dot pattern 160a and converted into green (G) light, and the unabsorbed light may be reflected to the pores P of the silica aerogel film 180 and reabsorbed into the green quantum dot pattern 160a. Subsequently, the light reabsorbed into the green quantum dot pattern 160a may be emitted to the green color filter 142b, thereby maximizing light extraction efficiency.

In the case of a pixel provided with the red color filter 142c, red (R) light emitted from the WOLED 122 may be emitted through the red quantum dot pattern 160b, the silica aerogel film 180, and the red color filter 142c.

Blue (B) and green (G) light emitted from the WOLED 122 may be partially absorbed into the red quantum dot pattern 160b and converted into red (R) light, and the unabsorbed light may be reflected to the pores P of the silica aerogel film 180 and reabsorbed into the red quantum dot pattern 160b. Subsequently, the light reabsorbed into the red quantum dot pattern 160b may be emitted to the red color filter 142c, thereby maximizing light extraction efficiency.

As described above, the OLED display device 100 according to the second aspect of the present disclosure may include the silica aerogel film 180 with excellent total reflection and scattering properties disposed between the quantum dot pattern 160 and the color filter 142, and as a result, may have a recycle structure in which light that is lost while passing through the quantum dot pattern 160 among light emitted from the WOLED 122 is reabsorbed into the quantum dot pattern 160 and emitted toward the color filter 142.

Accordingly, the OLED display device 100 according to the second aspect of the present disclosure may improve total light extraction efficiency by increasing light absorption of the quantum dot pattern 160 through application of the silica aerogel film 180 with excellent total reflection and scattering properties.

Figure 8:
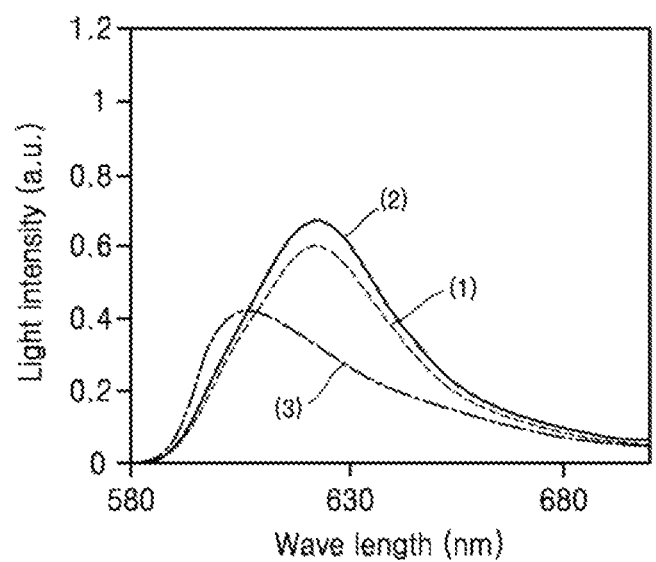
FIGS. 8 and 9 illustrate results of light intensity measurement for each wavelength band of the OLED display devices according to the present disclosure and the related art.
Figure 9:
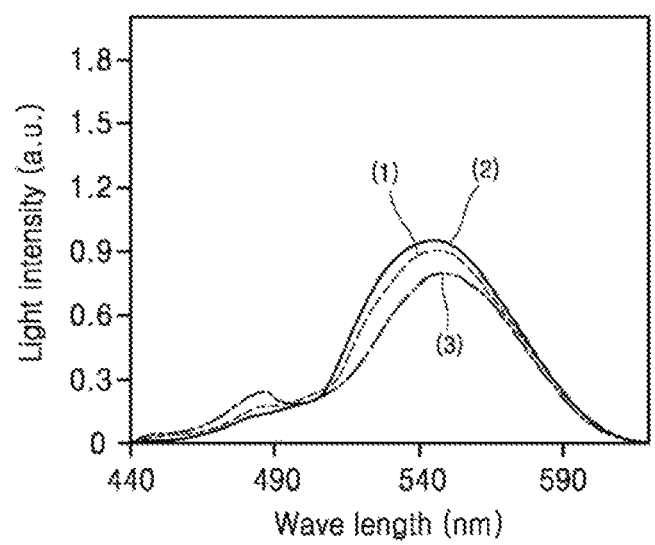

Table 1 illustrates results of measuring light extraction increase rates of the OLED displays devices according to the first and second aspects of the present disclosure and the related art. FIG. 8 and FIG. 9 are graphs illustrating results of measuring light intensity for each wavelength band of the OLED display devices according to the first and second aspects of the present disclosure and the related art.

TABLE 1

| Division | Light extraction increase rate (%) | |
| --- | --- | --- |
| | Red | Green |
| Related art | — | — |
| First aspect | 34.1 | 9.8 |
| Second aspect | 48.8 | 14.0 |

As illustrated in FIGS. 8 and 9, it can be seen that an OLED display device (1) according to the first aspect and an OLED display device (2) according to the second aspect each have increased light intensity for each wavelength band in comparison to an OLED display device (3) according to the related art.

As illustrated in Table 1, a light extraction rate of the OLED display device (1) according to the first aspect has increased to 34.1% and 9.8% at a red pixel and a green pixel, respectively, in comparison to the OLED display device (3) according to the related art.

In particular, a light extraction rate of the OLED display device (2) according to the second aspect has increased to 48.8% and 14.0% at a red pixel and a green pixel, respectively, in comparison to the OLED display device (3) according to the related art.

From the above experimental results, it can be seen that a structure of the second aspect using the quantum dot pattern and the refractive film together may further increase light extraction efficiency than that of the second aspect using the quantum dot pattern.

The present disclosure is described with reference to aspects described herein and accompanying drawings, but is not limited thereto. It should be apparent to those skilled in the art that various changes or modifications which are not exemplified herein but are still within the spirit and scope of the present disclosure may be made.

The invention claimed is:

1. An organic light emitting diode (OLED) display device, comprising:
   a thin film transistor substrate including a first substrate, a thin film transistor disposed on the first substrate and a white organic light emitting diode (WOLED) electrically connected to the thin film transistor;
   a color filter substrate comprising a second substrate that faces the first substrate, and red, green and blue color filters disposed on the second substrate;
   a quantum dot pattern disposed on the WOLED of the thin film transistor substrate; and
   a silica aerogel film having a plurality of pores which disposed in an integrated structure between the color filter substrate and the thin film transistor substrate provided with the quantum dot pattern, wherein the plurality of pores in the silica aerogel film therein which reflect an unabsorbed light from the quantum dot pattern into the quantum dot pattern.

2. The OLED display device of claim 1, wherein the quantum dot pattern comprises a green quantum dot pattern disposed between the WOLED and the green color filter, and a red quantum dot pattern disposed between the WOLED and the red color filter.

3. The OLED display device of claim 2, wherein the silica aerogel film is disposed on the green quantum dot pattern and the red quantum dot pattern to overlap with the green quantum dot pattern and the red quantum dot pattern.

4. The OLED display device of claim 1, wherein the silica aerogel film has a refractive index of 1.1 or less.

5. The OLED display device of claim 1, wherein each of the plurality of pores has an average diameter of 10 to 50 nm.

6. The OLED display device of claim 1, wherein the silica aerogel film has a thickness of 10 μm or less.

7. An organic light emitting diode (OLED) display device, comprising:
- a thin film transistor substrate including a first substrate, a thin film transistor disposed on the first substrate and a WOLED connected to the thin film transistor;
- a color filter substrate including a second substrate that faces the first substrate, and red, green and blue color filters disposed on the second substrate;
- a silica aerogel film having a plurality of pores formed on the red, green and blue color filters, the silica aerogel film disposed in an integrated structure between the color filter substrate and the thin film transistor substrate; and
- a quantum dot pattern disposed on the silica aerogel film, the quantum dot film disposed between the thin film transistor substrate and the reflective film, wherein the plurality of pores in the silica aerogel film therein which reflect an unabsorbed light from the quantum dot pattern into the quantum dot pattern.

8. The OLED display device of claim 7, wherein the quantum dot pattern comprises a green quantum dot pattern disposed between the WOLED and the green color filter, and a red quantum dot pattern disposed between the WOLED and the red color filter.

9. The OLED display device of claim 7, wherein the silica aerogel film has an area corresponding to the thin film transistor substrate.

10. The OLED display device of claim 7, wherein the silica aerogel film has a refractive index of 1.1 or less.

11. The OLED display device of claim 7, wherein the plurality of pores each have an average diameter of 10 to 50 nm.

12. The OLED display device of claim 7, wherein the silica aerogel film has a thickness of 10 μm or less.

13. An organic light emitting diode (OLED) display device, comprising:
- a thin film transistor disposed on a first substrate;
- a white organic light emitting diode disposed on the first substrate and electrically connected to the thin film transistor;
- red, green and blue color filters disposed on the second substrate;
- a silica aerogel film having a plurality of pores disposed in an integrated structure between the color filter substrate and the thin film transistor substrate and disposed on the red, green and blue color filters; and
- a green quantum dot pattern disposed on the silica aerogel film having the plurality of pores and corresponding to the green color filter; and
- a red quantum dot pattern disposed on the silica aerogel film having the plurality of pores and corresponding to the red color filter, wherein the plurality of pores in the silica aerogel film therein which reflect an unabsorbed light from the green quantum dot pattern into the green quantum dot pattern and reflect an unabsorbed light from the red quantum dot pattern into the red quantum dot pattern.

14. The OLED display device of claim 13, wherein the silica aerogel film has a refractive index of 1.1 or less.

* * * * *